United States Patent [19]

Ghaemian

[11] Patent Number: 5,054,545

[45] Date of Patent: Oct. 8, 1991

[54] HEAT EXCHANGER FOR A SEALED CABINET

[75] Inventor: Allen Ghaemian, Atlanta, Ga.

[73] Assignee: Northern Telecom Limited, Montreal, Canada

[21] Appl. No.: 621,987

[22] Filed: Dec. 4, 1990

[51] Int. Cl.⁵ .................. F28F 3/02; H01L 23/467
[52] U.S. Cl. .................. 165/104.33; 165/104.34; 165/122; 165/135; 165/166; 361/384
[58] Field of Search .............. 165/104.34, 104.33, 165/166, 165, 122, 135; 361/384

[56] References Cited

U.S. PATENT DOCUMENTS

| | | | |
|---|---|---|---|
| 4,706,739 | 11/1987 | Noven | 165/122 |
| 4,767,262 | 8/1988 | Simon | 165/122 |
| 4,798,238 | 1/1989 | Ghiraldi | 165/104.33 |
| 4,802,060 | 1/1989 | Immel | 165/104.33 |
| 4,807,441 | 2/1989 | Agee et al. | 165/104.34 |

*Primary Examiner*—Albert W. Davis, Jr.
*Attorney, Agent, or Firm*—Foley & Lardner

[57] ABSTRACT

A sealed cabinet is provided for housing heat generating electronic equipment. The sealed cabinet includes access doors which sealingly engage the cabinet in a closed position and a head space within the cabinet and above the doors for housing a heat exchanger. The heat exchanger includes longitudinal air channels, and transverse air channels, the channels formed by a stacked arrangement of longitudinal convoluted fins and transverse convoluted fins, each separated from the other by a heat conductive sheet. Outside air access to the heat exchanger is provided by louvered openings in opposite faces of the cabinet. The heat exchanger is sealed into the head space to keep outside air separated from air within the sealed cabinet. Fans force outside air through the longitudinal air channels and air within the sealed cabinet through the transverse air channels.

2 Claims, 3 Drawing Sheets

HEAT EXCHANGER FOR A SEALED CABINET

This invention relates to a heat exchanger for a sealed cabinet and is particularly concerned with cabinets intended to withstand exposure to the natural environment.

BACKGROUND OF THE INVENTION

The need to isolate electronic equipment from ambient environmental conditions is well known. For example, U.S. Pat. No. 4,807,441, issued Feb. 28, 1989 to Keith D. Agree et al. and assigned to Allied-Signal Inc., teaches a cooling system for a sealed enclosure. This enclosure prevents air internal to the cabinet from intermixing with air external to the cabinet. Thus, for example, the equipment cabinet could be placed in an environment of higher humidity than the exposed equipment would tolerate. Heat exchange from the internal air to the external air is accomplished using an externally mounted heat sink or an external corrugated fin arrangement which keeps the internal and external air separated. Both of these arrangements rely on external natural convection for the heat transfer. While this arrangement is adequate for some applications, applications with equipment requiring relatively high power dissipation and with cabinets intended for use outdoors with exposure to various weather conditions, require protection of the heat exchanger fins from exposure to direct solar energy, contamination from dirt, snow, or ice, and corrosion.

SUMMARY OF THE INVENTION

An object of the present invention is to provide an improved heat exchanger for a sealed cabinet.

In accordance with one aspect of the present invention there is provided a sealed cabinet for housing heat generating electronic equipment, said cabinet comprising: a door on a face of the cabinet for access to the equipment, the door sealingly engaging the cabinet in a closed position; a head space within the cabinet and above the door, for housing a heat exchanger; and a plurality of louvered openings in opposite faces of the cabinet for the passage of outside air through the heat exchanger; wherein the heat exchanger includes a plurality of longitudinal air channels communicating with the louvered openings for passing outside air therethrough, while keeping outside air separated from air within the sealed cabinet; a plurality of transverse air channels for passing air within the sealed cabinet therethrough; a first plurality of fans for forcing outside air through the plurality of longitudinal air channels and a second plurality of fans for forcing air within the sealed cabinet through the plurality of transverse air channels.

In accordance with another aspect of the present invention there is provided a sealed cabinet for housing heat generating electronic equipment, said cabinet comprising: a head space within the cabinet for housing a heat exchanger; and a plurality of louvered openings in opposite faces of the cabinet for the passage of outside air through the heat exchanger; wherein the heat exchanger includes a first plurality of air channels communicating with the louvered openings for passing outside air therethrough, while keeping outside air separated from air within the sealed cabinet; a second plurality of air channels for passing air within the sealed cabinet therethrough; and first and second pluralities of fans for forcing air within the sealed cabinet through first and second pluralities of air channels, respectively.

In accordance with a further aspect of the present invention there is provided a sealed cabinet for housing heat generating electronic equipment, said cabinet comprising: doors on a face of the cabinet for access to the equipment, the doors sealingly engaging the cabinet in a closed position; a head space within the cabinet and above the doors, for housing a heat exchanger; and a plurality of louvered openings in opposite faces of the cabinet for the passage of outside air through the heat exchanger; wherein the heat exchanger includes a plurality of longitudinal air channels; a plurality of transverse air channels, the channels formed by a stacked arrangement of longitudinal convoluted fins and transverse convoluted fins, each separated from the other by a separating sheet, the plurality of longitudinal air channels communicating with the louvered openings for passing outside air therethrough, while keeping outside air separated from air within the sealed cabinet, the plurality of transverse air channels for passing air within the sealed cabinet therethrough; a first plurality of fans for forcing outside air through the plurality of longitudinal air channels; and a second plurality of fans for forcing air within the sealed cabinet through the plurality of transverse air channels.

In an embodiment of the present invention a heat exchanger comprises a plurality of layers of convoluted fins, in which each layer is oriented approximately orthogonally with respect to an adjacent layer with a separating sheet therebetween.

BRIEF DESCRIPTION OF THE DRAWINGS

The present invention will be further understood from the following description with reference to the drawings in which.

Similar references are used in different figures to denote similar components.

DETAILED DESCRIPTION

Figure 1:
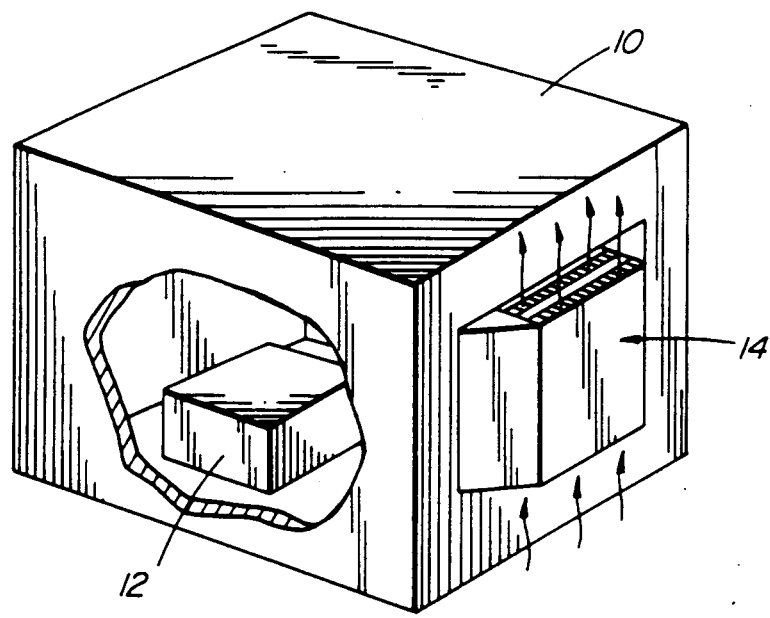
FIG. 1 illustrates in a perspective view a known cooling system and sealed cabinet.
Figure 2:
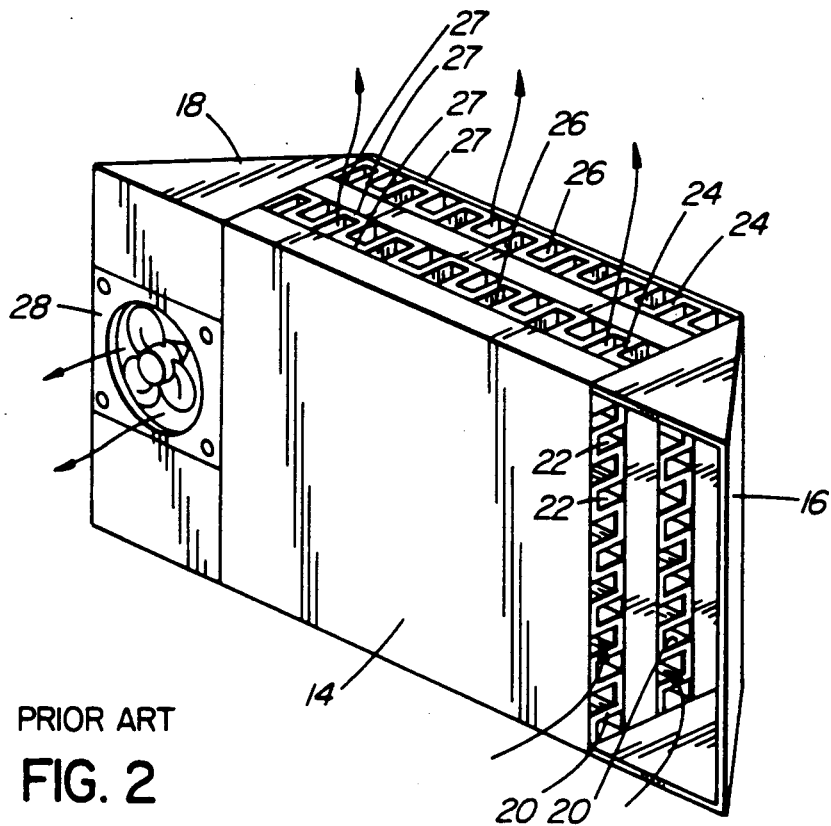
FIG. 2 illustrates in a perspective view a heat exchanger for the cooling system of FIG. 1.

Referring to FIG. 1, there is illustrated a known sealed cabinet and heat exchanger arrangement, shown in partial cutaway isometric view. The sealed cabinet 10, houses heat generating equipment 12 and is cooled by an externally mounted heat exchanger 14. FIG. 2 provides detail of the structure of the heat exchanger 14 of FIG. 1. The heat exchanger 14 includes an inlet shroud 16 and an outlet shroud 18, longitudinally corrugated fins 20 which form a plurality of horizontal channels 22 coupling the inlet and outlet ends of the heat exchanger 14, intervening transversely corrugated fins 24 form a plurality of vertical channels 26 which are exposed to air outside the sealed cabinet. Longitudinally corrugated fins 20 and horizontally corrugated fins 24 are separated by separator sheets 27. A baffled fan 28 is mounted within the outlet shroud 18.

In operation, the fan 28 draws cabinet air into the inlet shroud 16, along the plurality of horizontal channels 22, and out through the outlet shroud 18 back into the cabinet 10. Air exterior to the cabinet 10 moves upwardly through the plurality of vertical channels 26 under natural convection. Heat from the equipment 12 is carried by the cabinet air to the longitudinally corrugated fins 20. The heat is then conducted from the longitudinally corrugated fins 20 through a separator sheet 27 to transversely corrugated fins 24. From the transversely corrugated fins 24, which are oriented vertically, the heat is transferred to the outside air by natural convection.

For equipment requiring relatively low heat dissipation and in a relatively clean, albeit hostile environment, a heat exchanger arrangement such as that of FIGS. 1 and 2 provides simple and reliable cooling. The arrangement of FIGS. 1 and 2 also prevents the admixture of cabinet air with outside air. However, for cabinets situated outdoors, exposed to weather which may include direct sunlight, dirt or snow accumulation, exposed fins may be problematic.

Figure 3:
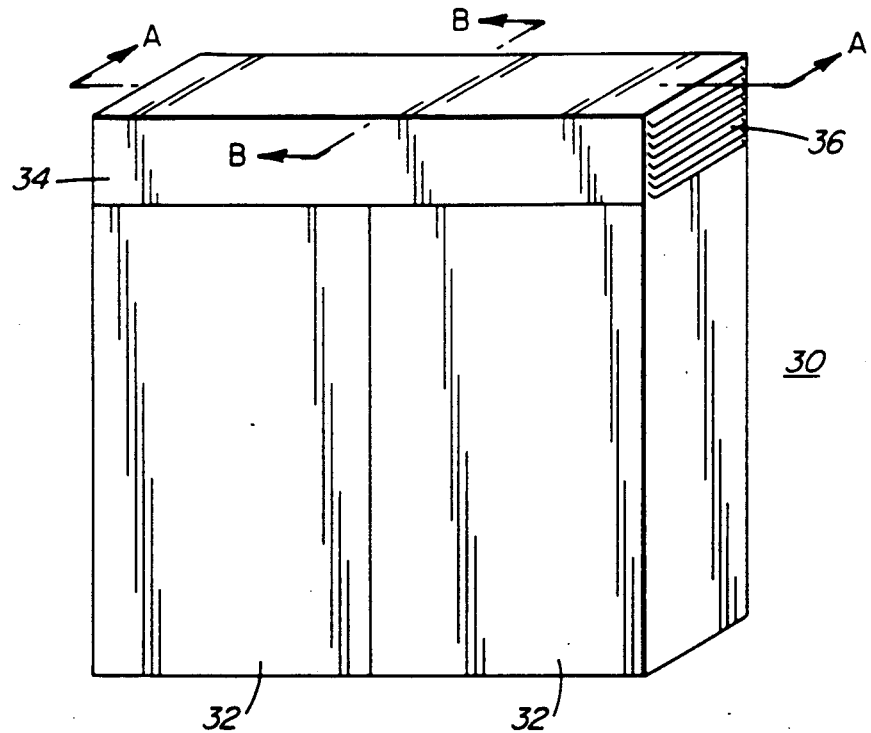
FIG. 3 illustrates an oblique view of a cabinet in accordance with an embodiment of the present invention.

Referring to FIG. 3, there is illustrated an oblique view of a cabinet in accordance with an embodiment of the present invention. A cabinet 30 includes access doors 32 and a head space 34 for housing a heat exchanger (not shown in FIG. 3). Air access to the heat exchanger is provided by a plurality of louvered openings 36 on each side of the cabinet 30 within the head space 34. The access doors 32 are provided with sealing gaskets in known manner to prevent infiltration of outside air when closed.

Figure 4:
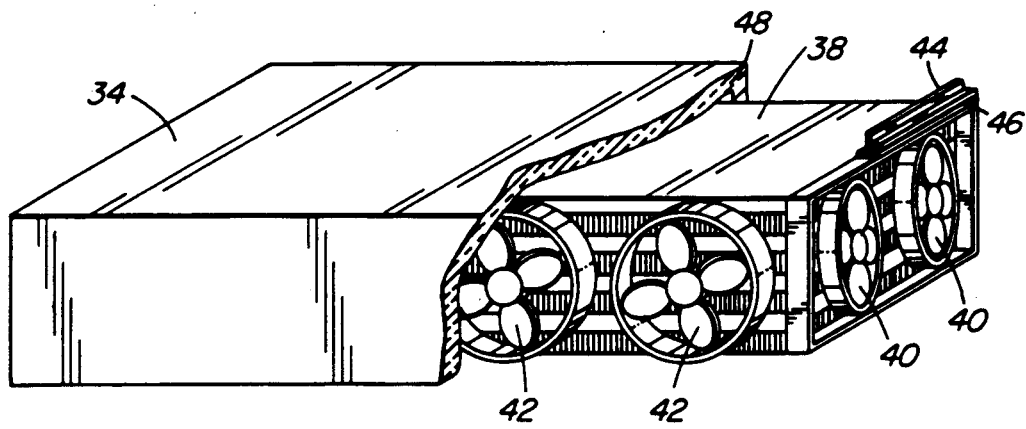
FIG. 4 illustrates a partially cutaway oblique view of the heat exchanger mounted in the cabinet of FIG. 3.

FIG. 4. illustrates the heat exchanger mounted in the cabinet in a partially cutaway oblique view. Within the head space 34, is housed a heat exchanger 38. The heat exchanger 38 includes a plurality of fans 40 on both ends for forcing through outside air. The heat exchanger also includes a plurality of fans 42 along the length of both sides for forcing through cabinet air. A bracket 44, shown partially cutaway, and elastomeric gasket 46, shown partially cutaway, at each end of the heat exchanger 38 provides for mounting within the cabinet 30 and separation of the cabinet air and the outside air.

In operation, the plurality of fans 42 draws cabinet air across the heat exchanger 38 then back into the cabinet 10. The plurality of fans 40 draws outside air along the length of the heat exchanger 38. Heat from equipment (not shown in FIGS. 3 and 4) within the cabinet 30, is carried by the cabinet air to the heat exchanger 38, where it is transferred to the outside air. Also shown in FIG. 4, is a layer of insulation 58 which lines the upper inner surface of the cabinet head space 34 and the front and rear (not shown in FIG. 4) inner surfaces. Details of the heat transfer are discussed below in connection with FIGS. 5, 6, and 7.

Figure 5:
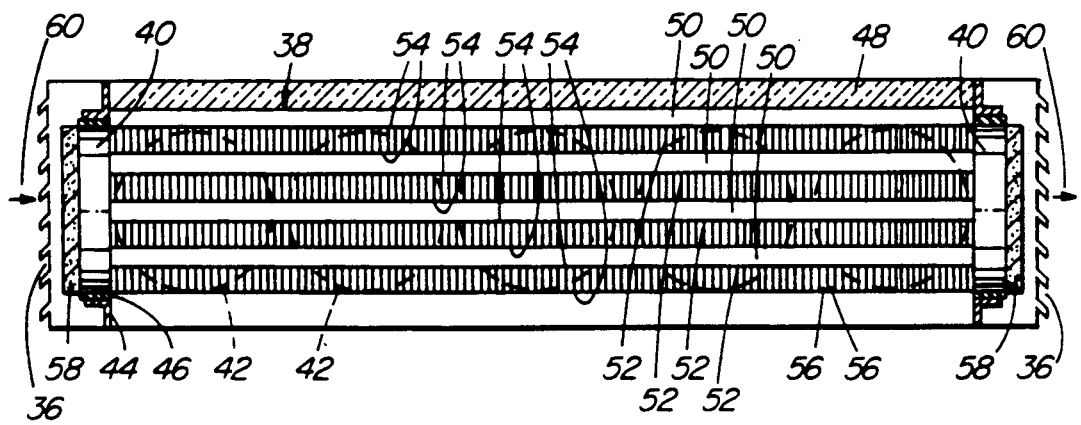
FIG. 5 illustrates a cross-section through A—A of the heat exchanger mounted in the cabinet of FIG. 3.

Referring to FIG. 5, there is illustrated a cross-section through A—A of the heat exchanger 38 mounted in the cabinet 30 of FIG. 3. The heat exchanger 38 comprises a stacked arrangement of longitudinal convoluted fins 50 and transverse convoluted fins 52 each separated from the other by separator sheets 54. Each layer of longitudinal convoluted fins 50 together with adjacent separator sheets 54 form a plurality of air channels (not shown in FIG. 5) along the length of the heat exchanger 38. Each layer of transverse convoluted fins 52 together with adjacent separator sheets 54 forms a plurality of air channels 56 across the heat exchanger 38. Bonding of the separator sheet along its edges to the convoluted fin adjacent and parallel to those edges, prevents admixture of air flowing in the transverse and longitudinal convoluted fins at the longitudinally and transversely opposed faces of the heat exchanger. Such bonding may be by any convenient method which ensures an airtight seal, for example epoxy bonding. One of the plurality of fans 40 at each end of the heat exchanger is shown. The plurality of fans 42 along one side of the heat exchanger 38 is shown in broken line outline. Between the plurality of fans 40 and the plurality of louvered openings 36 is an air filter 58. The bracket 44 and elastomeric gasket 46 form a seal between the outside air and cabinet air within the headspace 34.

Figure 6:
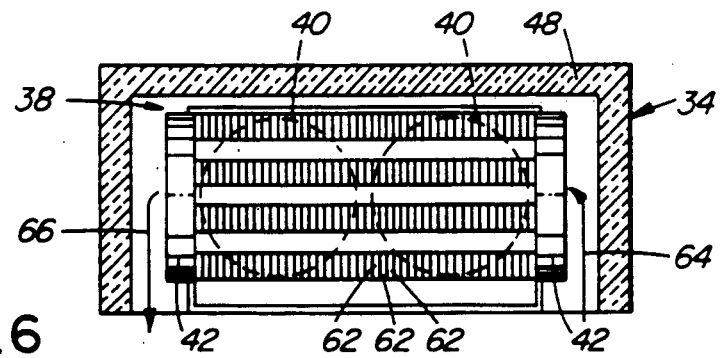
FIG. 6 illustrates a cross-section through B—B of the heat exchanger mounted in the cabinet of FIG. 3.

Referring to FIG. 6, there is illustrated a cross-section through B—B of the heat exchanger mounted in the cabinet of FIG. 3. The plurality of air channels 62 along the length of the heat exchanger 38 are shown in this cross-section. Also shown in FIG. 6, is the layer of insulation 48 which lines the upper inner surface, and the front and rear inner surfaces of the head space 34.

In operation, the plurality of fans 40, shown in broken line outline in FIG. 6, draws outside air into the heat exchanger 38 via the louvered openings 36, in the direction of arrows 60. The outside air passes through the heat exchanger via the plurality of air channels 62 formed by the stacked arrangement of longitudinal convoluted fins 50 and separator sheets 54. The plurality of fans 40 draws the outside air out the other set of the plurality of louvered openings 36. Heat from equipment (not shown in FIGS. 5 and 6) within the cabinet and carried by the cabinet air to the heat exchanger 38 is then transferred by conduction from the longitudinal convoluted fins 50 through the separator sheets 54 to the transverse convoluted fins 52. The plurality of fans 42 draws cabinet air into the heat exchanger 38 from the rear of the cabinet 30 as indicated by an arrow 64. Cabinet air passes through the heat exchanger via the plurality of air channels 56 formed by the stacked arrangement of transverse convoluted fins 52 and separator sheets 54. The plurality of fans 42 then returns cabinet air from the heat exchanger 38 to the front of the cabinet 30 as indicated by an arrow 66.

Figure 7:
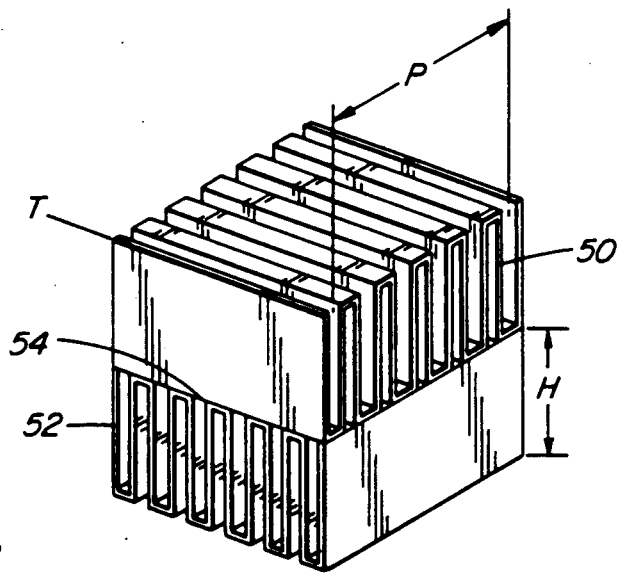
FIG. 7 illustrates an isometric detailed view of a portion of the heat exchanger of FIGS. 4–6.

FIG. 7 illustrates an isometric detailed view of a portion of the heat exchanger of FIGS. 4–6. Alternate layers of the longitudinal convoluted fins 50, separator sheet 54, and transverse convoluted fins 52 are shown.

In an embodiment of the present invention the following components are used. The convoluted fins are manufactured by EG&G Wakefield Engineering. Typical dimensions for the convoluted fins are a fin height H of 0.6 inch, pitch P of 12 fins per inch, and thickness T of 0.010 inch. The convoluted fins are irriditied by anticorrosion chromate for protection from humidity and salty coastal environments. The separating sheet 54 is an aluminum plate with a typical thickness of 0.025 inch. The insulation 48 is provided by an insulation board of one inch thickness with an R value of 8. The fans 40 and 42 are 6 inch 240 cfm operating on −48 Vdc. The air filters 58 are 0.5 inch thick 30 PPi foam.

An advantage of the present invention is sheltering and insulating the heat exchanger from direct exposure to outside weather conditions. This eliminates problems of contamination of the heat exchanger fins by sand, mud, snow or ice and of solar gain through direct exposure to solar radiation. Another advantage is the use of convoluted fins which provide a relatively large heat transfer surface compared with that provided by the corrugated fins of Agree et al. Convoluted fins are also corrosion protected as described above.

Numerous modifications, variations and adaptations may be made to the particular embodiments of the invention described above without departing from the scope of the invention, which is defined in the claims.

What is claimed is:

1. A sealed cabinet for housing heat generating electronic equipment, said cabinet comprising:
   a door on a face of the cabinet for access to the equipment, the door sealingly engaging the cabinet in a closed position;
   a head space within the cabinet and above the door;
   a heat exchanger mounted in the head space;
   a plurality of louvered openings in opposite faces of the cabinet for the passage of outside air through the heat exchanger;
   wherein the heat exchanger includes:
   a plurality of longitudinal air channels communicating with the louvered openings;
   a plurality of transverse air channels, the longitudinal and transverse air channels being formed by a plurality of layers of convoluted fins, wherein each of the layers is oriented approximately orthogonally with respect to an adjacent layer;
   a first plurality of fans for forcing outside air through the longitudinal air channels and the louvered openings;
   a second plurality of fans for forcing air within the sealed cabinet through the transverse air channels;
   a separating sheet disposed between adjacent layers;
   a layer of insulation lining inner faces of the head space adjacent the faces having the plurality of louvered openings; and
   an air filter disposed between the louvered openings and the first plurality of fans;
   wherein the first plurality of fans are adjacent each longitudinally opposed face of the heat exchanger and the second plurality of fans are adjacent each transversely opposed face of the heat exchanger.

2. A sealed cabinet as claimed in claim 1 wherein the convoluted fins have a fin height of about 0.6 inch, a pitch of about 12 fins per inch, and have a thickness of about 0.010 inch, and wherein the separating sheet has a thickness of about 0.025 inch.

* * * * *